(12) United States Patent
Meany

(10) Patent No.: US 7,583,130 B2
(45) Date of Patent: Sep. 1, 2009

(54) INPUT BIASING SYSTEM FOR BRACKETING A FLOATING POWER SUPPLY ABOUT AN INPUT SIGNAL

(75) Inventor: Thomas J. Meany, Bruff (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/248,494

(22) Filed: Oct. 12, 2005

(65) Prior Publication Data
US 2006/0087364 A1    Apr. 27, 2006

Related U.S. Application Data

(60) Provisional application No. 60/618,794, filed on Oct. 14, 2004.

(51) Int. Cl.
*G11C 5/14* (2006.01)
(52) U.S. Cl. .................................. 327/530; 326/30
(58) Field of Classification Search ................ 327/530; 326/30
See application file for complete search history.

(56) References Cited

U.S. PATENT DOCUMENTS 4,797,630 A * 1/1989 Brown ..................... 330/264
4,808,846 A * 2/1989 Huijsing ................... 327/101
5,861,775 A * 1/1999 Chen et al. .................. 330/69
6,492,881 B2 * 12/2002 Wright et al. ................ 333/26
6,593,870 B2   7/2003 Dummermuth et al. ..... 341/155
6,691,923 B2 * 2/2004 Shearer ..................... 236/78 R

OTHER PUBLICATIONS

Maxim Integrated Products, MAX253, Transformer Driver for Isolated RS-485 Interface, pp. 1-15, 1994.
Linear Technology, LTC1531, Self-Powered Isolated Comparator, pp. 1-16, 1998.
Analog Devices, AD202/AD204, Low Cost, Miniature Isolation Amplifiers, pp. 1-12, 2002.
Allen-Bradley, ControlLogix Analog I/O Modules, User Manual, Publication 1756-6.5.9—Nov. 1998, Cat. No. 1756—IF16, IF6I, IF8, IR6I, IT6I, OF4, OF6CI, OF6VI. OF8, pp. 1.1-12.4.
Pickering, Paul, *A System Designer's Guide to Isolation Devices*, Sensors Magazine Online, Jan. 1999, pp. 1-10, 1999.

* cited by examiner

*Primary Examiner*—Kenneth B. Wells
(74) *Attorney, Agent, or Firm*—Kenyon & Kenyon LLP

(57) ABSTRACT

An input biasing system for accommodating a floating power supply to the range of an input signal includes input terminals for receiving a input signal and a biasing circuit including a first impedance connected between one of the input terminals and a floating power supply and a second impedance connected between another of the input terminals and the ground of the floating power supply for bracketing the floating power supply about the input signal.

27 Claims, 10 Drawing Sheets

INPUT BIASING SYSTEM FOR BRACKETING A FLOATING POWER SUPPLY ABOUT AN INPUT SIGNAL

RELATED APPLICATIONS

This application claims priority of U.S. Provisional Application No. 60/618,794 filed Oct. 14, 2004, incorporated by reference herein.

FIELD OF THE INVENTION

This invention relates to an input biasing system for accommodating a floating power supply to the range of an input signal, and in one application in an isolated analog input system for bracketing a floating power supply about the range of a data acquisition signal.

BACKGROUND OF THE INVENTION

Floating power supplies have application in data acquisition operations. In order to protect sensitive input circuits from extraneous noise and voltages during operation in a noisy environment, various data acquisition circuits have been devised which provide electrical "isolation" between the noisy environment and the input circuitry. In effect such data acquisition devices allow an input circuit to electrically "float" with respect to the electrical circuit ground in the noisy environment while measuring the desired signal developed across the sensing element. Therefore the input circuitry can measure the desired signal but is unaffected by transients and extraneous noise. However, the "floating" side of the board still needs to communicate with the low voltage computer or control side of the board and power needs to be provided to the "floating" side. In one approach the floating power supply has a negative rail and a positive rail and the rail to rail voltage must exceed the range of the expected data input signal. Typically an available voltage such as +5 volts has to be isolated through a transformer, optoisolator, or other device then stepped up to +15 volts and then converted to provide −15 volts. With typical efficiencies of 20%, 95% and 80%, for example, the overall efficiency to obtain the +15 volt rail to rail is a little better than 15%. The charge pumps, switching regulators or whatever is used to produce the enlarged rail to rail voltage results in large area and power requirements. Further, negative rail low currents, inversely, require large inductors also increasing area and power requirements. In addition, the power supply range is not centered or balanced on the data acquisition signal and so any attenuators needed to reduce the signal level to accommodate subsequent components, e.g. analog to digital converters must be relatively large.

SUMMARY OF THE INVENTION

It is therefore an object of this invention to provide an input biasing system for accommodating a floating power supply to the range of a data input signal.

It is a further object of this invention to provide such an input biasing system in which the floating power supply range need be no greater than the data input signal range.

It is a further object of this invention to provide such an input biasing system which avoids the need for a negative rail.

It is a further object of this invention to provide such an input biasing system which reduces power requirements by eliminating components, e.g. charge pumps, switching regulators, needed to produce the positive rail.

It is a further object of this invention to provide such an input biasing system which avoids the need for large, power consuming inductors required to produce negative rail low current.

It is a further object of this invention to provide such an input biasing system which results in reduced area and power requirements.

It is a further object of this invention to provide such an input biasing system which avoids the inefficiency of converting low to high voltages and generating rail to rail voltages.

It is a further object of this invention to provide such an input biasing system which can bias the floating power supply not only to bracket the range of the data input signal but balanced or centered on that signal thereby avoiding the need for rail to rail power supplies and their attendant high power requirements as well as providing improved performances and permitting use of smaller attenuators where required.

It is also an object of this invention to provide an isolated analog input system for bracketing a floating power supply about the range of a data acquisition signal.

The invention results from the realization that a truly simple and elegant input biasing system for accommodating a floating power supply to the range of a data input signal without excessive range or a negative rail can be achieved with an input biasing circuit including a first impedance connected between one of the input terminals and the floating power supply and a second impedance connected between another of the input terminals and the ground of the floating power supply for bracketing the floating power supply about the data input signal.

The subject invention, however, in other embodiments, need not achieve all these objectives and the claims hereof should not be limited to structures or methods capable of achieving these objectives.

This invention features an input biasing system for accommodating a floating power supply to the range of an input signal. There are input terminals for receiving a floating input signal and a biasing circuit including a first impedance connected between one of the input terminals and the floating power supply and a second impedance connected between another of the input terminals and the ground of the floating power supply for bracketing the floating power supply about the input signal.

In a preferred embodiment the impedances may be equal and the floating power supply may be centered on the input signal. The impedances may be resistances; the biasing circuit may include a unidirectional current device in parallel with at least one of the impedances for decreasing response time. The biasing circuit may include a unidirectional current device in parallel with each of the impedances for decreasing response time. There may be a unidirectional current device in parallel between the first impedance and the ground of the floating power supply. There may be a unidirectional current device in parallel between the second impedance and the floating power supply. There may be an attenuator circuit for reducing the magnitude of the input signals. The unidirectional current devices may include diodes.

The invention also features an isolated analog input system for accommodating an isolated floating power supply to the range of a data acquisition signal including an analog to digital converter for receiving at its inputs a differential data acquisition signal. There is a biasing circuit including a first impedance connected between one of the analog to digital converter inputs and the isolated floating power supply and a second impedance connected between another of the analog to digital converter inputs and the ground of the isolated floating power supply for bracketing the isolated floating power supply about the data acquisition signal.

In a preferred embodiment the impedances may be equal and the isolated floating power supply may be centered on the data acquisition signal. The impedances may be resistances. The biasing circuit may include a unidirectional current device in parallel with at least one of the impedances for decreasing response time. The biasing circuit may include a unidirectional current device in parallel with each of the impedances for decreasing response time. The biasing circuit may include a unidirectional current device in parallel between the first impedance and the ground of the floating power supply. The biasing circuit may include a unidirectional current device between the second impedance and the floating power supply. The unidirectional current devices may be diodes.

This invention also features an input biasing system for accommodating a floating power supply to the range of an input signal including a floating power supply and input terminals for receiving an input signal. There is a biasing circuit including a first impedance connected between one of the input terminals and the floating power supply and a second impedance connected between another of the input terminals and the ground of the floating power supply for bracketing the floating power supply about the input signal.

In a preferred embodiment the floating power supply may be a positive power supply; it may be a negative power supply.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
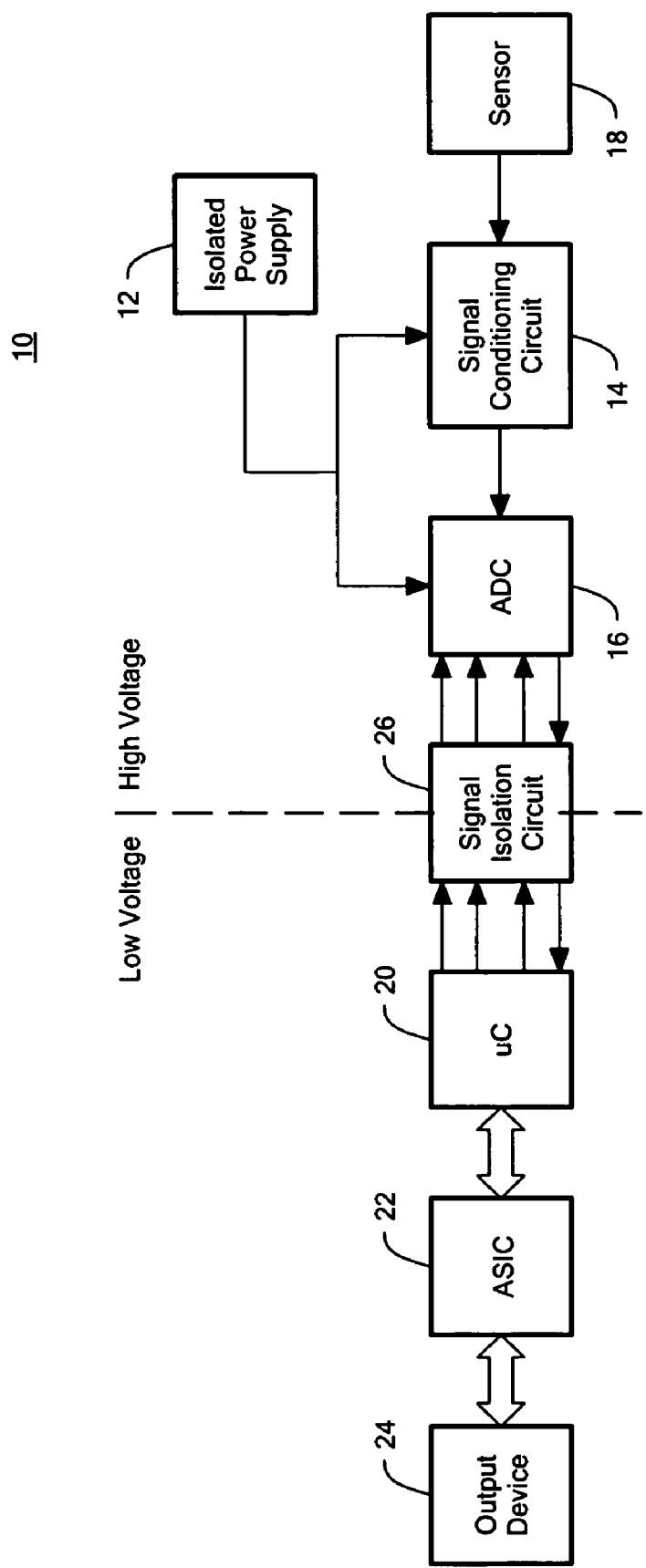
FIG. 1 is a block diagram of an isolated analog input system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 an isolated analog input system 10 having a high voltage side and a low voltage side. The high voltage side includes an isolated power supply 12 which powers a signal conditioning circuit 14 and an analog to digital converter 16. Typically a sensor 18 senses some physical quantity and delivers the input to signal conditioning circuit 14. The low voltage side includes a micro-computer 20 whose output is connected to an application specific integrated circuit (ASIC) 22 that drives some output device 24. The high voltage side is separated from the low voltage side by a signal isolation circuit 26 which may be an optoisolator, magnetic isolator, RF isolator or any suitable isolation device.

Figure 2:
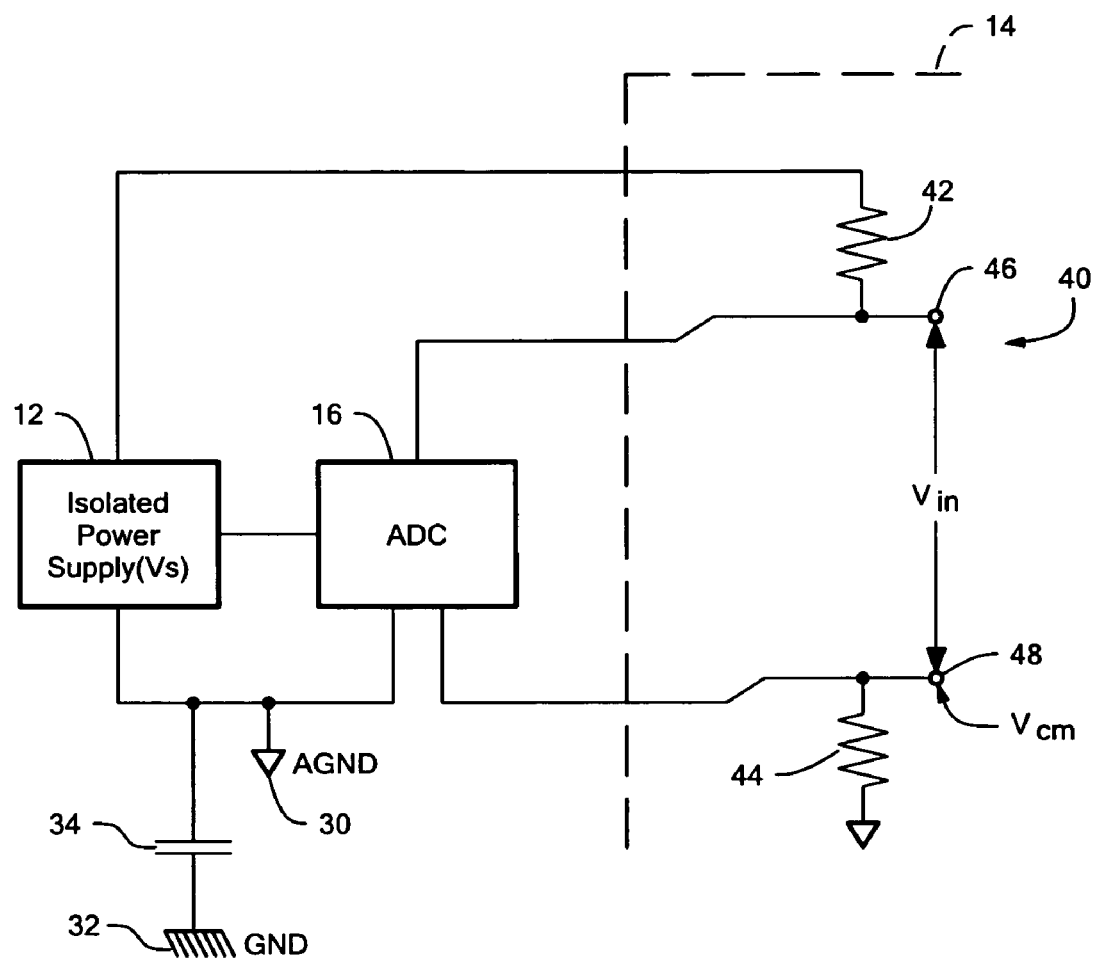
FIG. 2 is a more detailed view of a portion of the analog input system of FIG. 1 showing the analog to digital converter, floating power supply and an input biasing system according to this invention.

Isolated power supply 12 may be a floating isolated power supply, FIG. 2, whose ground AGND 30 floats above chassis ground 32 with a typical parasitic capacitance 34 of 100 pf, for example. In accordance with this invention an input biasing system 40, contained in signal conditioning circuit 14, includes impedances 42 and 44 which may be resistances, for example, of 100,000 ohms each. The input signal $V_{in}$ is provided at input terminals 46 and 48 superimposed on a common mode voltage $V_{cm}$.

Figure 3:
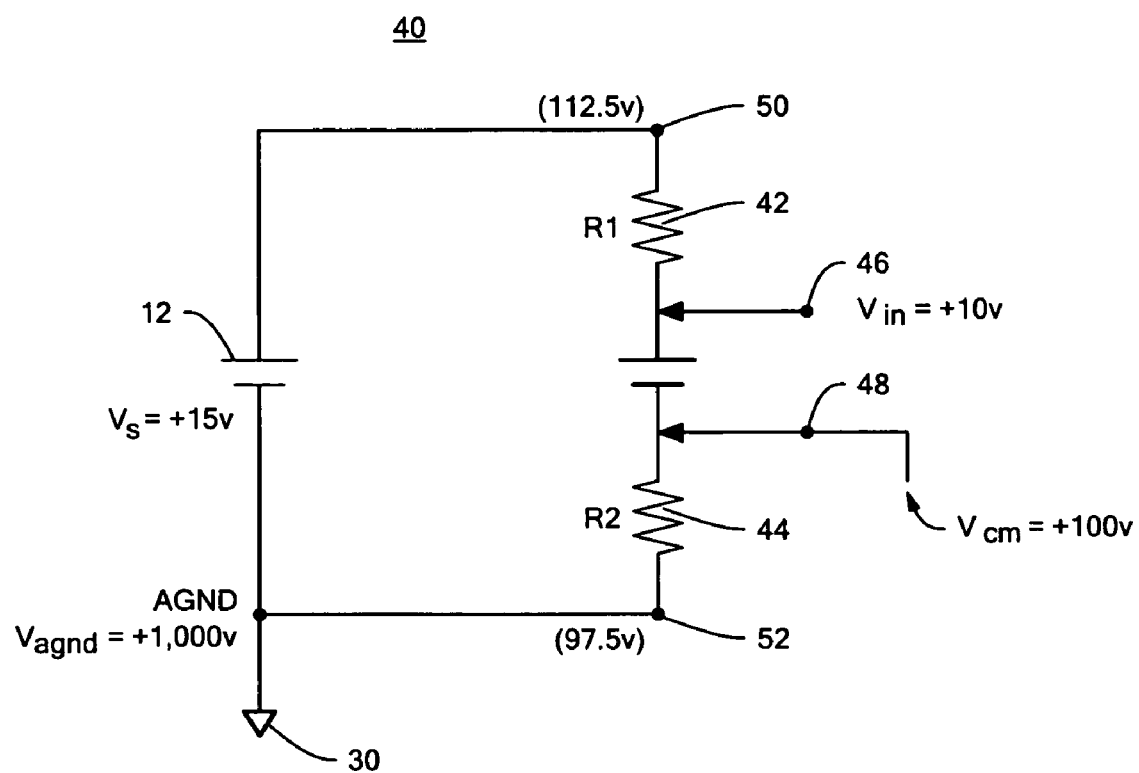
FIG. 3 is a simplified schematic of the input biasing system of FIG. 2.

The accommodation of the floating power supply to the range of the input signal whereby the floating power supply brackets the input signal can be seen with respect to the equivalent circuit in FIG. 3. There isolated floating power supply 12 is shown as being a simple +15 volt power supply rather than one which must supply + and −15 volts. $V_{in}$ is +10 volts and $V_{cm}$ is +100 volts. The current I flowing through the circuit is given by the expression $$I = \frac{V_s - V_{in}}{R1 + R2}$$

where R1, 42 and R2, 44 are 100,000 ohms each, $V_s$ is +15 volts, $V_{in}$ is +10 volts and I is 25 micro amps. With I at 25 micro amps the drop across each of the resistances 42 and 44 is 2.5 volts. Thus the voltage at point 50 is $V_{cm}+V_{in}+2.5$ or +112.5 volts, while the voltage at point 52 is (+100−2.5) volts or +97.5 volts. Since $V_{in}$ of +10 volts moves between +100 and +110 volts its center point is +105 volts. It can be seen then that +97.5 volts at 52 is 7.5 volts below the center point of $V_{in}$ while +112.5 volts at point 50 is 7.5 volts above the center point of $V_{in}$. Thus, the supply voltage $V_s$ has been positioned to nicely bracket the input voltage for $V_{in}$. This result occurs no matter what the level of floating ground 30 (AGND): it can be, for example, +1000 volts.

Figure 4:
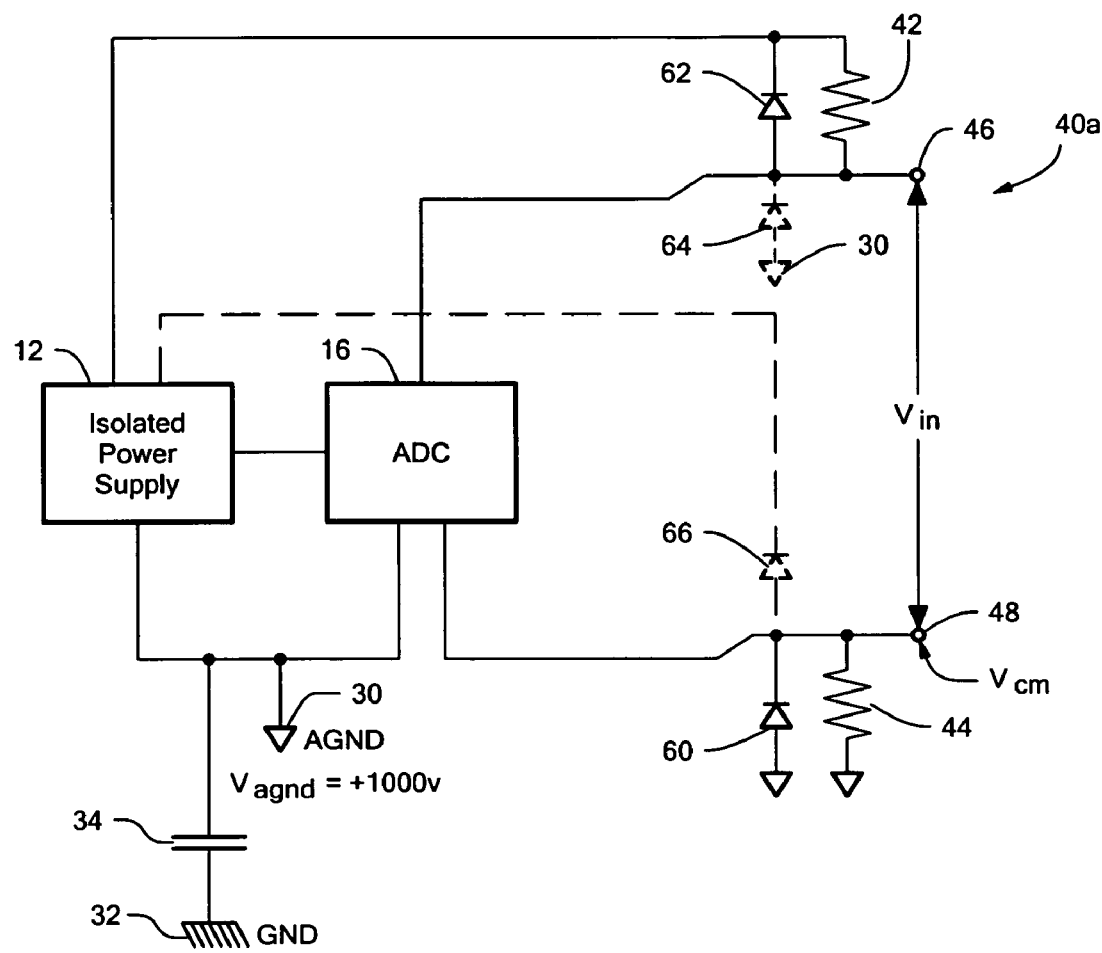
FIG. 4 is a view similar to FIG. 2 with diodes added for faster response time.
Figure 5:
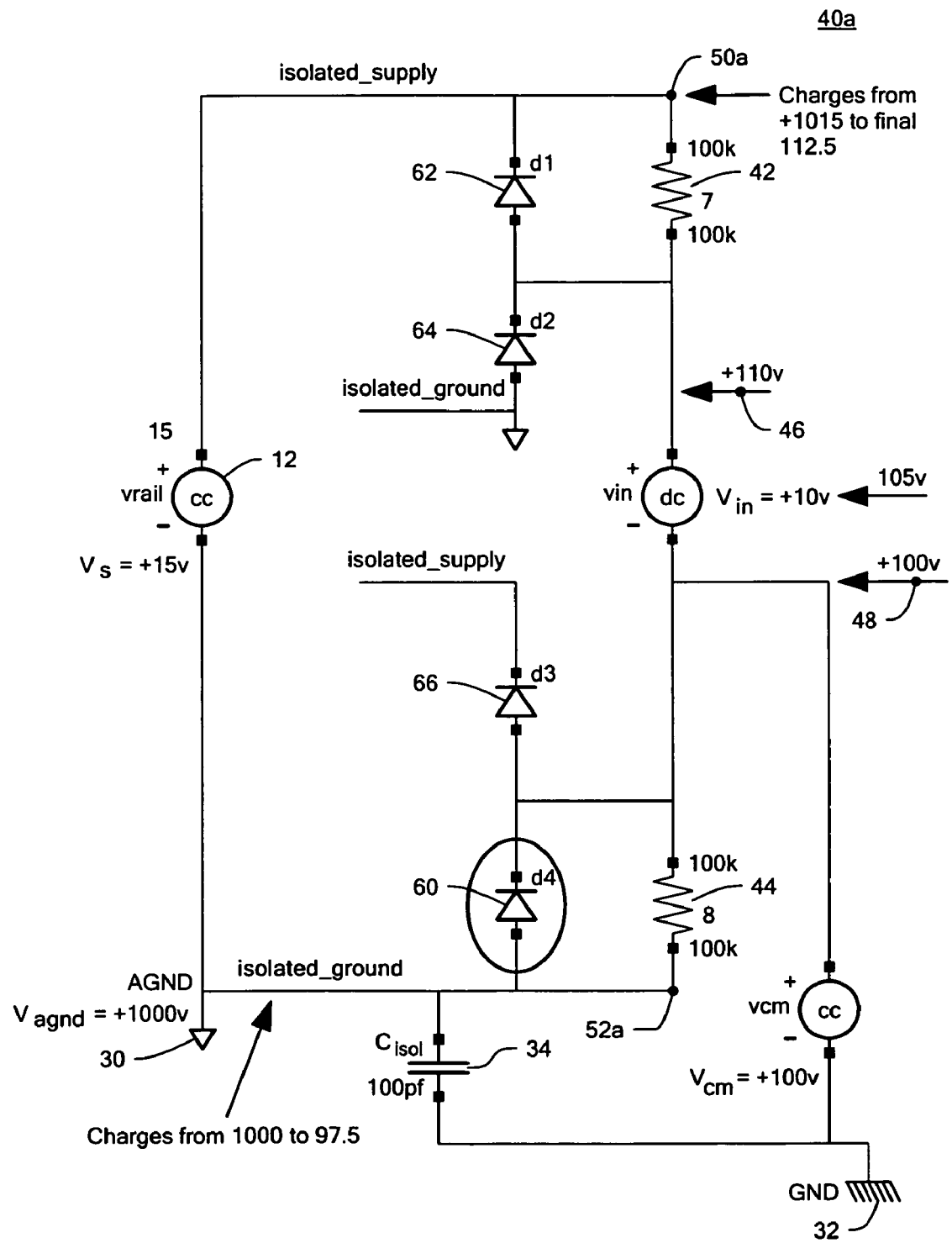
FIGS. 5-9 are simplified schematic views of FIG. 4 illustrating the bracketing of the input signal by the floating power supply for different conditions of $V_{in}$, $V_{cm}$ and $V_s$.

The response time can be increased by adding unidirectional current devices, e.g., diodes to the input biasing system 40a, FIG. 4. For example, diode 60 can be added in parallel with impedance 44 and diode 62 in parallel with impedance 42. Additionally diode 64 can be added in parallel between impedance 42 and isolated power supply ground 30 and diode 66 can be added in parallel with impedance 44 and isolated power supply 12. While four diodes have been used 60, 62, 64, 66 other unidirectional current devices would suffice. By providing all four diodes, all four conditions of + and − values for the floating voltage $V_{AGND}$, at floating ground 30 AGND and $V_{in}$ can be accommodated. Each diode 60, 62, 64, 66 operates to speed up response in a particular condition as illustrated by the combinations shown in Table 1 infra:

TABLE 1

|  | Initial $V_{AGND}$ | $V_{in}$ | $V_{cm}$ |
| --- | --- | --- | --- |
| Diode 60 | +1,000 v | +10 v | +100 v |
| Diode 62 | −1,000 v | +10 v | +100 v |

TABLE 1-continued

|  | Initial $V_{AGND}$ | $V_{in}$ | $V_{cm}$ |
|---|---|---|---|
| Diode 64 | +1,000 v | −10 v | +100 v |
| Diode 66 | −1,000 v | −10 v | +100 v |

Diode 60 operates when $V_{AGND}$ is positive and $V_{in}$ is positive. Diode 62 operates when $V_{AGND}$ is negative and $V_{in}$ is positive. Diode 64 operates when $V_{AGND}$ is positive and $V_{in}$ is negative and diode 66 operates when $V_{AGND}$ is negative and $V_{in}$ is negative. Examples of operations in these four conditions are shown in FIGS. 5, 6, 7, and 8 following. Initially, FIG. 5, with the isolated ground $V_{AGND}$ at +1000 v, the isolated floating power supply 12 $V_s$ at +15 volts, the common mode voltage $V_{cm}$ at +100 v and $V_{in}$ at +10 v, the isolated ground at 30 charges from +1000 v to +97.5 volts through diode 60 so that point 52a is at +97.5 volts. This charging takes place in two stages, in stage 1 the current flows through diode 60 until $V_{AGND}$ has fallen to 100.7 volts. In stage 2 current flows through resistor 44 and completes when $V_{AGND}$ has settled to +97.5". Likewise point 50a charges from +1015 volts (that is, a combination of the isolated ground voltage $V_{AGND}$ of +1,000 plus $V_s$ of +15 volts) to a final voltage of +112.5 volts. The +112.5 volts and +97.5 volts nicely bracket the +105 volts center voltage of input signal $V_{in}$ of +10 volts in combination with common mode voltage $V_{cm}$ at +100 volts.

Figure 6:
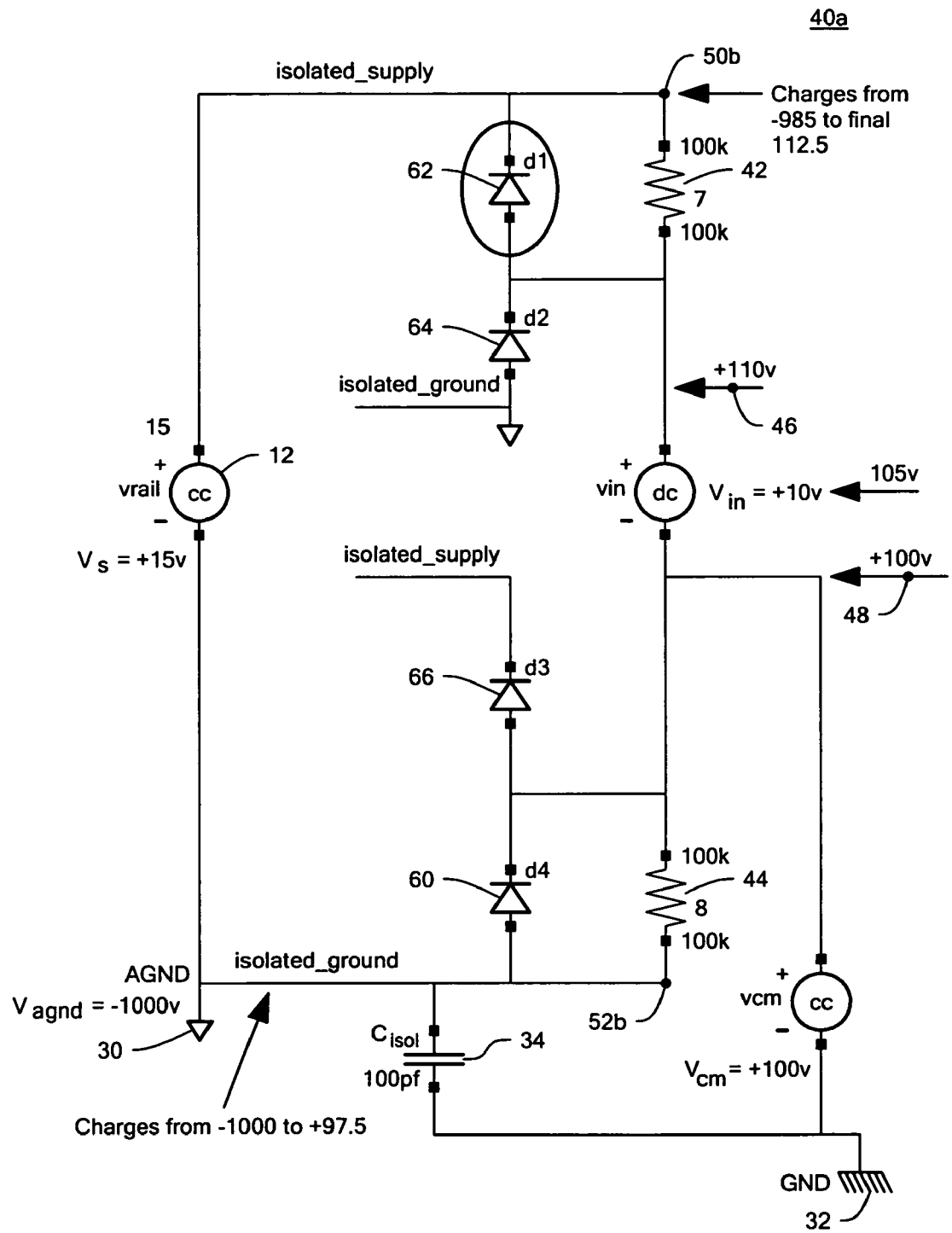

In FIG. 6, given the same circumstances except that the isolated ground voltage $V_{AGND}$ is −1,000 volts, point 52b charges from −1,000 volts to +97.5 volts through diode 62. Likewise point 50b charges from −985 volts, (that is, the $V_{AGND}$ at −1,000 volts minus $V_s$ at +15 volts equals −985 volts), to a final voltage of +112.5 volts. Since $V_{in}$ is still +10 volts and its center point is still +105 volts the +15 volt power supply nicely brackets the +105 volt center point with its +97.5 volts at 52b and +112.5 at 50b.

Figure 7:
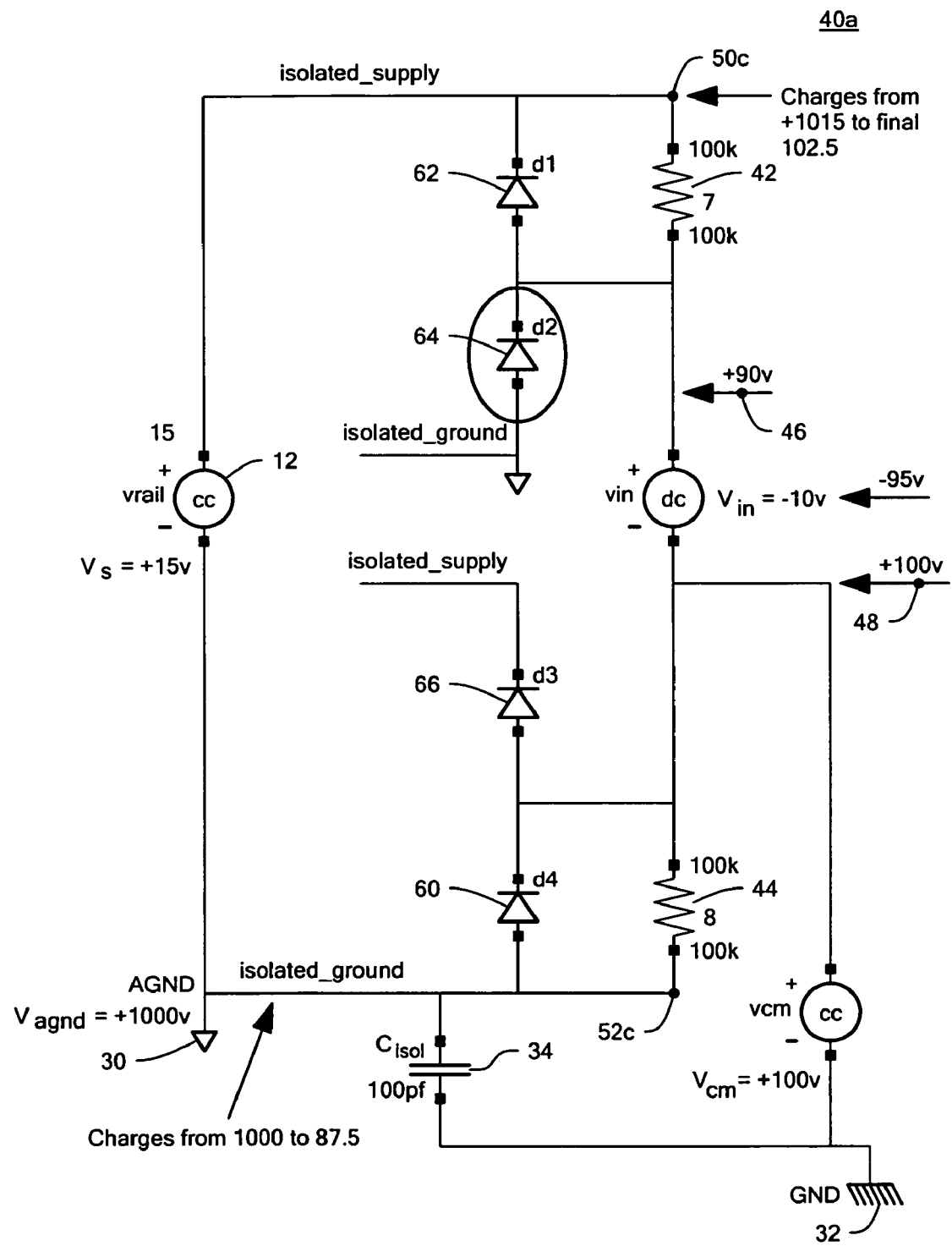

Now with the isolated ground voltage $V_{AGND}$ at +1,000 again but $V_{in}$ at −10 volts, operation is at shown at FIG. 7, there the isolated ground charges from $V_{AGND}$ at +1,000 to +87.5 volts at point 52c through diode 64 and point 50c charges from +1,015 volts to a final value of +102.5 volts. Since the center point of $V_{in}$ is now at +95 volts the +102.5 volts at 50c and the +87.5 volts at 52c nicely bracket the +90 to +100 volt excursion around the center point +95 volts. If you analyze the circuit in this case then the currents flowing in resistors 42, 44 are now +155 uA. This illustrates the need to keep resistors 42, 44 high to minimize this current.

Figure 8:
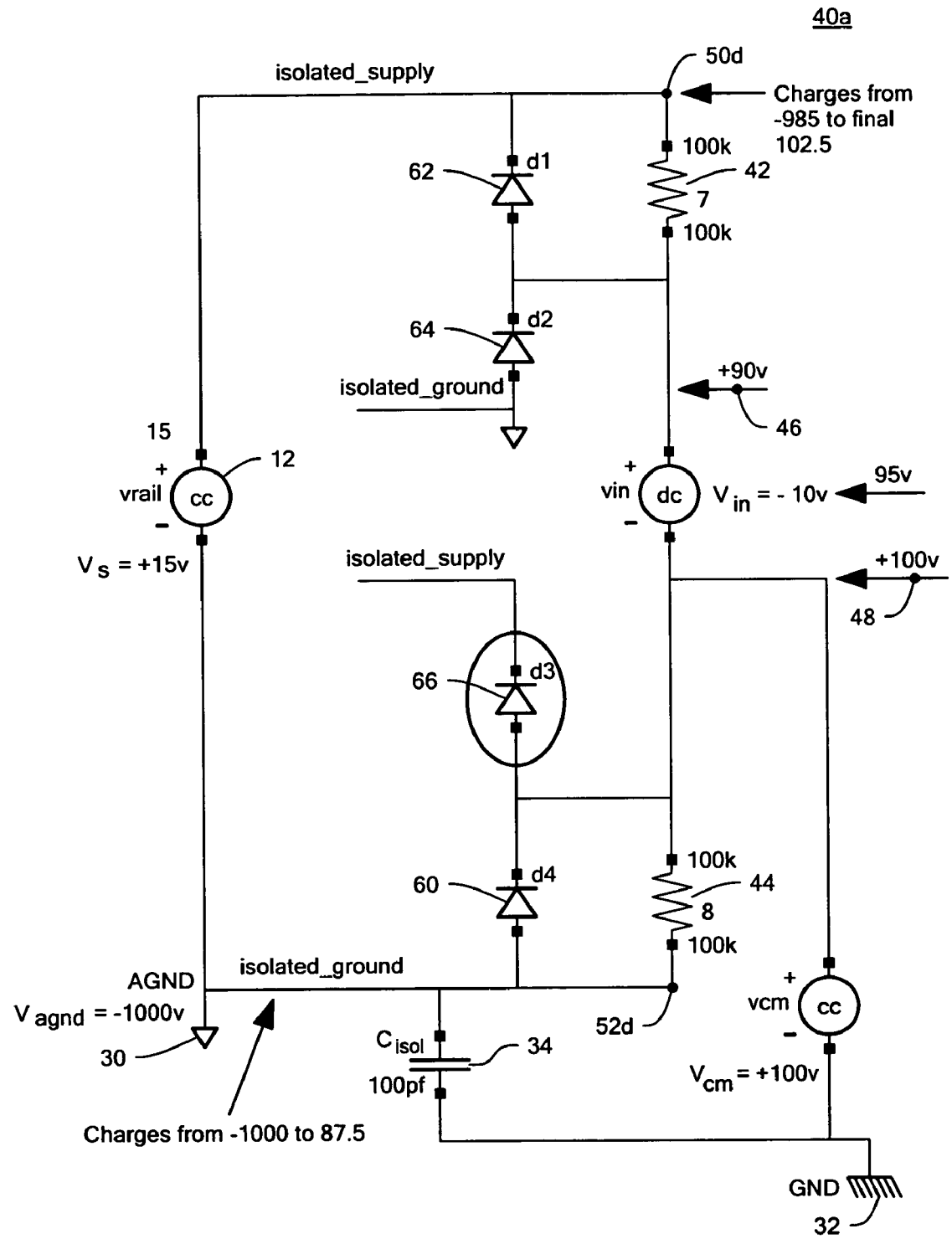

And finally, when the isolated ground voltage $V_{AGND}$ is −1,000 volts and $V_{in}$ is −10 volts, operation is depicted in FIG. 8. There, isolated ground 30, $V_{AGND}$, charges from −1,000 volts to +87.5 volts through diode 66 while point 50d charges from −985 volts to +102.5 volts. Since $V_{in}$ at −10 volts moves between +90 volts and +100 volts the +102.5 volts of point 50d and +87.5 volts of 52d nicely bracket the center +95 volt point of $V_{in}$. In each case the operative diodes bring the voltages to within a diode drop of $V_{cm}$ or $V_{cm}+V_{in}$ depending on the polarity of $V_{in}$. Thereafter the resistors balance the circuit. The on-impedance of the diodes is far less than that of the resistors so that the diodes serve to dramatically increase the response time to changes in $V_{in}$ or $V_{common}$.

Figure 9:
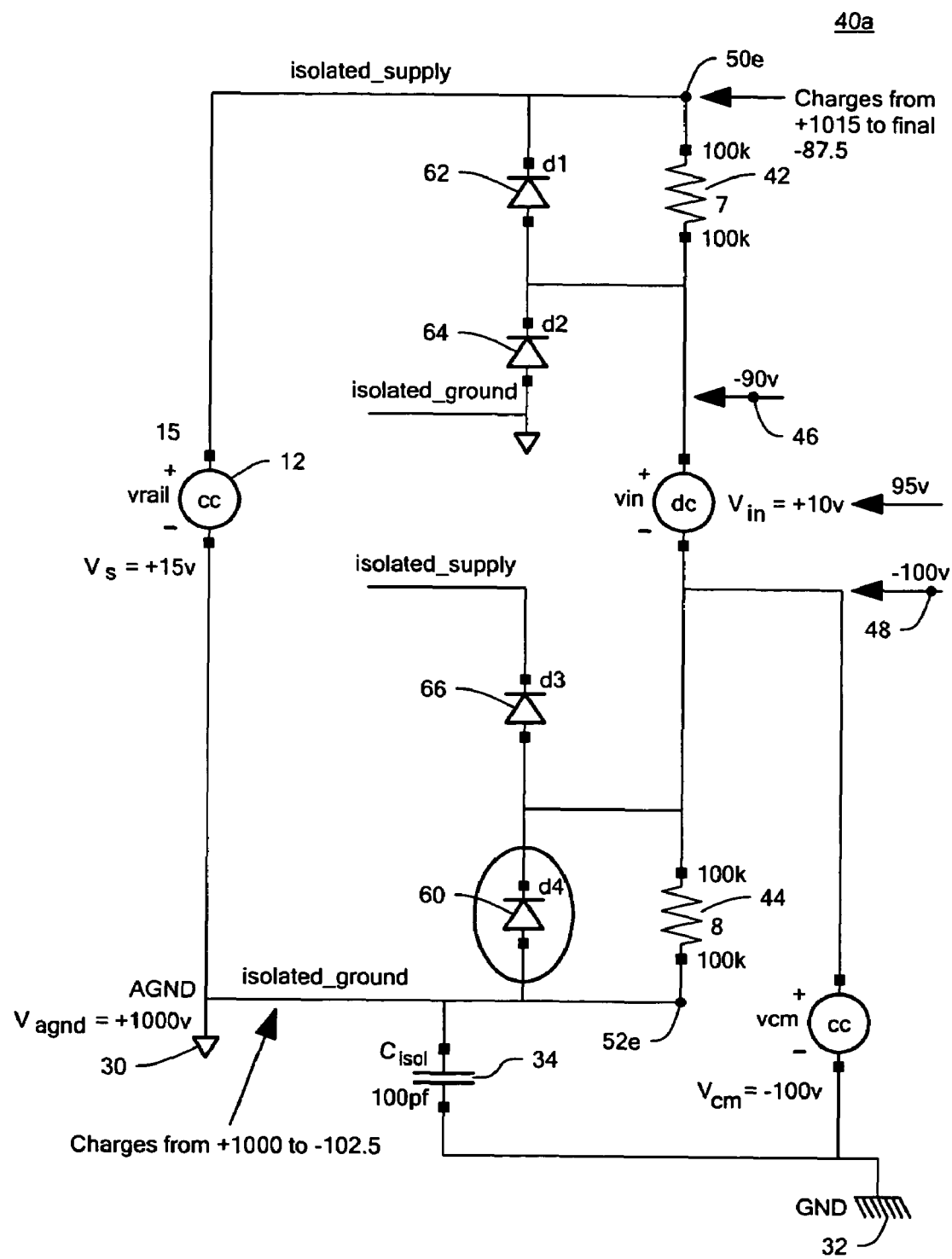

Although thus far each of the examples for the four conditions in FIGS. 5, 6, 7, and 8 are shown with a positive common mode voltage, $V_{cm}$ equal +100 volts, this is not a necessary limitation of the invention. For example, as shown in FIG. 9, the system of this invention performs with negative common mode voltages as well. Here the isolated floating power supply 12, $V_s$ is at +15 volts and the input signal $V_{in}$ is at +10 volts and the isolated ground voltage $V_{AGND}$ is at +1000 volts. But the common mode voltage is at −100 volts, and conditions diode 60 to operate and charge point 52e from +1,000 to −102.5 volts, while point 50e charges from +1015 volts to −87.5 volts. With $V_{in}$ at +10 volts it moves between −90 volts and −100 volts so that its center point is at −95 volts. This is again nicely bracketed by the −87.5 volts at point 50e and the −102.5 volts at point 52e. The invention also works when the supply voltage instead of being a positive is a negative, for example, $V_s$ equal to −15 volts.

While throughout this discussion these examples use diodes 60, 62, 64 and 66, this is not a necessary limitation of the invention: other unidirectional current devices are suitable. In addition while the impedances 42 and 44 have been shown as equal, i.e. as each being 100 k ohm resistances this, too, is not a necessary limitation of the invention. While making the impedances 42 and 44 equal nicely centers or balances the floating power supply's bracketing of the input signal, this is not a necessary limitation of the invention. In some cases it is desirable to have the floating power supply bracketing the input signal but not necessarily centered on it. It that case the impedances 42 and 44 can be made unequal in some ratio, for example, two to one or three to two, to shift the floating power supply so that while it is still brackets the input signal it is not centered on it but is off toward one side or the other of the input signal.

Figure 10:
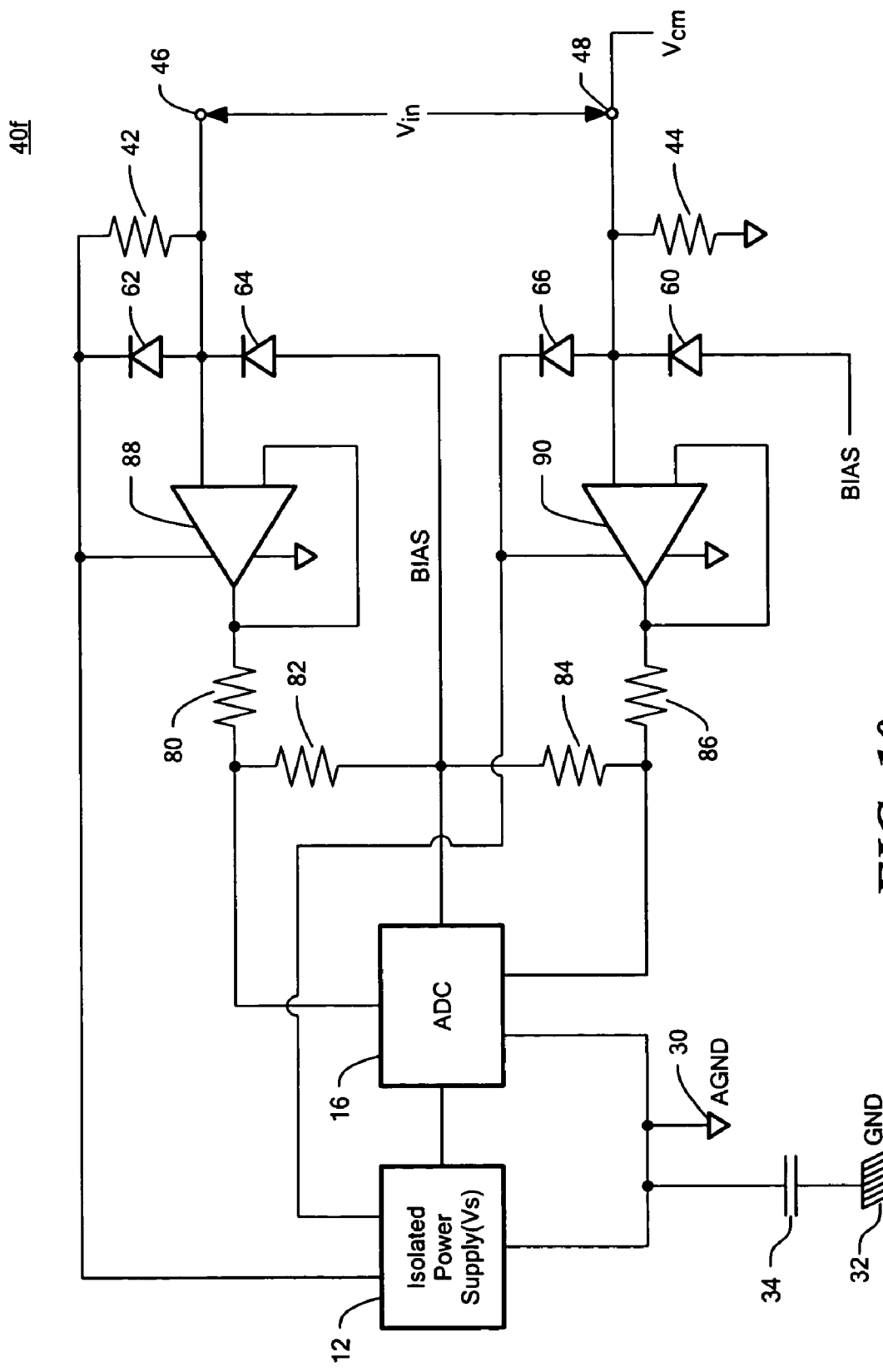
FIG. 10 is a view similar to FIG. 2 showing another embodiment of the invention.

In another embodiment 40f, FIG. 10, an attenuator circuit has been added including resistances 80, 82, 84, and 86 for cases in which the input signal, for example, $V_{in}$ equals +10 volts, is too large for ADC 16 which may, for example, only have an input capacity of 2 volts. Resistances 80, 82, 84, and 86 then reduce the magnitude of the input signal. Resistances 80 and 86 may, for example, be in the range of 1 meg ohm. If analog to digital converter 16 can't handle inputs of 1 meg ohm then resistances 80 and 86 may be reduced to 10 k ohms and the attenuator circuit will have added to it amplifiers 88 and 90 to complete the necessary attenuation match. Looking at FIG. 10 for a $V_{in}$ of 10V and a floating supply of 15V, supply of amplifier 88 is 2.5V above the input 46 and the ground of amplifier 90 is 2.5 volts below the amplifier input pin 48. This bracketing action ensures amplifier headroom for $V_{in}$<+/−15V. Another difference in system 40f, FIG. 10, is that diodes 60 and 64 need not be connected to isolated or floating ground but may be connected to a bias, for example of 2.5 volts in order to let the diode action continue closer to the final voltage before resistor action completes the operation.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An input biasing system for adjusting the voltage levels of a single floating power supply about the voltage range of an input data signal comprising:
    input terminals for receiving the input data signal; and
    a biasing circuit including a first impedance connected between one of said input terminals and the floating power supply and a second impedance connected between another of said input terminals and the ground of the floating power supply for adjusting the voltage levels of the floating power supply about the voltage levels of the input signal to adjust the lower voltage of the floating power supply below the lower voltage level of the input data signal and the higher voltage level of the floating power supply above the higher voltage level of the input data signal, the biasing circuit configured to adjust the floating power supply about both positive and negative voltage input data signals.

2. The input biasing system of claim 1 in which said impedances are equal and the upper and lower voltage levels of said floating power supply are centered about the upper and lower voltage levels of said input signal.

3. The input biasing system of claim 2 in which said impedances are resistances.

4. The input biasing system of claim 1 in which said biasing circuit includes a unidirectional current device in parallel with at least one of said impedances for decreasing response time.

5. The input biasing system of claim 4 in which said biasing circuit further includes a unidirectional current device in parallel with each of said impedances for decreasing response time.

6. The input biasing system of claim 1 in which said biasing circuit further includes a unidirectional current device in parallel between said first impedance and the ground of said floating power supply for decreasing response time.

7. The input biasing system of claim 6 in which said biasing circuit further includes a unidirectional current device in parallel between said second impedance and said floating power supply for decreasing response time.

8. The input biasing system of claim 1 in which said biasing circuit includes an attenuator circuit for reducing the magnitude of the input signals.

9. The input biasing system of claim 4 in which said unidirectional current device includes a diode.

10. The input biasing system of claim 5 in which said unidirectional current device includes a diode.

11. The input biasing system of claim 6 in which said unidirectional current device includes a diode.

12. The input biasing system of claim 7 in which said unidirectional current device includes a diode.

13. An isolated analog input system for adjusting the voltage levels of an isolated floating power supply about the voltage range of a data acquisition signal comprising:
    an analog to digital converter for receiving at its inputs a differential data acquisition signal; and
    a biasing circuit including a first impedance connected between one of said analog to digital converter inputs and said isolated floating power supply and a second impedance connected between another of said analog to digital converter inputs and the ground of said isolated floating power supply for adjusting the voltage levels of said isolated floating power supply about the voltage levels of said differential data acquisition signal to adjust the lower voltage of the floating power supply below the lower voltage level of the differential data acquisition signal and the higher voltage level of the floating power supply above the higher voltage level of the differential data acquisition signal.

14. The isolated analog input system of claim 13 in which said impedances are equal and the upper and lower voltage levels of said isolated floating power supply are centered about the upper and lower voltage levels of said data acquisition signal.

15. The isolated analog input system of claim 14 in which said impedances are resistances.

16. The isolated analog input system of claim 13 in which said biasing circuit includes a unidirectional current device in parallel with at least one of said impedances for decreasing response time.

17. The isolated analog input system of claim 16 in which said biasing circuit further includes a unidirectional current device in parallel with each of said impedances for decreasing response time.

18. The isolated analog input system of claim 13 in which said biasing circuit further includes a unidirectional current device in parallel between said first impedance and the ground of said floating power supply for decreasing response time.

19. The isolated analog input system of claim 18 in which said biasing circuit further includes a unidirectional current device in parallel between said second impedance and said floating power supply for decreasing response time.

20. The isolated analog input system of claim 13 in which said biasing circuit further includes an attenuator circuit for reducing the magnitude of the differential data acquisition signals.

21. The isolated analog input system of claim 16 in which said unidirectional current device includes a diode.

22. The isolated analog input system of claim 17 in which said unidirectional current device includes a diode.

23. The isolated analog input system of claim 18 in which said unidirectional current device includes a diode.

24. The isolated analog input system of claim 19 in which said unidirectional current device includes a diode.

25. An input biasing system for adjusting the voltage levels of a single floating power supply about the voltage range of an input data signal comprising:
    a floating power supply;
    input terminals for receiving an input data signal; and
    a biasing circuit including a first impedance connected between one of said input terminals and the floating power supply and a second impedance connected between another of said input terminals and the ground of the floating power supply for adjusting the voltage levels of the floating power supply about the voltage levels of the input signal to adjust the lower voltage of the floating power supply below the lower voltage level of the input data signal and the higher voltage level of the floating power supply above the higher voltage level the input data signal, the biasing circuit configured to adjust the floating power supply about both positive and negative voltage input data signals.

26. The input biasing system of claim 25 in which said floating power supply is a positive power supply.

27. The input biasing system of claim 25 in which said floating power supply is a negative power supply.

* * * * *